United States Patent
Kim et al.

(10) Patent No.: US 11,983,030 B1
(45) Date of Patent: May 14, 2024

(54) CLOCK TRANSMISSION CIRCUIT

(71) Applicant: SK hynix Inc., Gyeonggi-do (KR)

(72) Inventors: Heon Ki Kim, Gyeonggi-do (KR); Dae Ho Yang, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 0 days.

(21) Appl. No.: 17/975,890

(22) Filed: Oct. 28, 2022

(30) Foreign Application Priority Data

May 24, 2022 (KR) .................... 10-2022-0063483

(51) Int. Cl.
   *G06F 1/04* (2006.01)
   *G06F 1/08* (2006.01)
   *H03K 3/037* (2006.01)

(52) U.S. Cl.
   CPC .............. *G06F 1/08* (2013.01); *H03K 3/037* (2013.01)

(58) Field of Classification Search
   CPC .... G06F 1/04; G06F 1/08; G06F 1/10; H03K 3/037

USPC .................... 327/211, 212, 291, 299
See application file for complete search history.

(56) References Cited

U.S. PATENT DOCUMENTS

| | | | |
|---|---|---|---|
| 6,222,791 B1 * | 4/2001 | Becker | G11C 7/22 327/212 |
| 10,892,742 B2 | 1/2021 | Koh et al. | |
| 2015/0171836 A1 * | 6/2015 | Lee | H03K 5/1565 327/175 |
| 2021/0218388 A1 | 7/2021 | Wang et al. | |

* cited by examiner

*Primary Examiner* — William Hernandez
(74) *Attorney, Agent, or Firm* — IP & T GROUP LLP

(57) ABSTRACT

A clock transmission circuit includes a clock driver circuit suitable for transmitting a clock and adjusting a driving force thereof in response to a boosting signal; a low-pass filter circuit suitable for receiving the clock and outputting an initialization signal; and a boosting signal generating circuit suitable for generating the boosting signal that is activated in response to the initialization signal and deactivated in response to the clock.

11 Claims, 6 Drawing Sheets

CLOCK TRANSMISSION CIRCUIT

CROSS-REFERENCE TO RELATED APPLICATIONS

The present application claims priority of Korean Patent Application No. 10-2022-0063483, filed on May 24, 2022, which is incorporated herein by reference in its entirety.

BACKGROUND

1. Field

Various embodiments of the present invention relate to a clock transmission circuit method for transmitting a clock in diverse integrated circuits.

2. Description of the Related Art

Various integrated circuits including memory devices are being developed to have high capacity and operate at a high speed with low power consumption. Semiconductor devices are designed to operate in synchronization with a clock whose frequency is increasing higher and higher to achieve an aim of high speed.

These days, the frequencies of clocks are getting higher than a gigahertz (GHz), and in order for a semiconductor device to operate accurately in synchronization with a high-frequency clock, the clock must also be very accurate. In other words, if a clock has a large amount of jitter or the duty ratio deviates from 50:50, the operation timings of the semiconductor devices operating in synchronization with it are also shifted, making it impossible to guarantee stable circuit operation.

A clock transmission circuit is used to transmit a clock inside semiconductor devices or to transmit a clock between semiconductor devices, and the clock transmitted by the clock transmission circuit is required to have a high quality.

SUMMARY

Embodiments of the present invention are directed to a clock transmission circuit capable of transmitting a high-quality clock.

In accordance with an embodiment of the present invention, a clock transmission circuit includes: a clock driver circuit suitable for transmitting a clock and adjusting a driving force thereof in response to a boosting signal; a low-pass filter circuit suitable for receiving the clock and outputting an initialization signal; and a boosting signal generating circuit suitable for generating the boosting signal that is activated in response to the initialization signal and deactivated in response to the clock.

In accordance with another embodiment of the present invention, a clock transmission circuit includes: a clock driver circuit suitable for transmitting a clock; and a driving force control circuit suitable for increasing a rising transition driving force of an output of the clock driver circuit in a section where the clock is of a low frequency and decreasing the rising transition driving force in a section where the clock is of a high frequency.

In accordance with still another embodiment of the present invention, a semiconductor apparatus includes: a clock driver configured to drive an input clock to output an output clock, the input clock staying high in a reset section, staying low in a pre-amble section and toggling in a post-amble section, and a set of the sections being repetitive; a low-pass filter configured to generate an initialization signal, which toggles when the input clock toggles at a low frequency and transitions according to transition of the input clock at both ends of the reset section; and a boosting circuit configured to enable a boosting signal according to a rising edge of the initialization signal and disable the boosting signal according to a rising edge of the input clock in the post-amble section, wherein the clock driver is further configured to increase, in response to the enabled boosting signal, a driving force thereof to accelerate at least initial transition of the output clock from a logic low level to a logic high level in the post-amble section.

DETAILED DESCRIPTION

Figure 1:
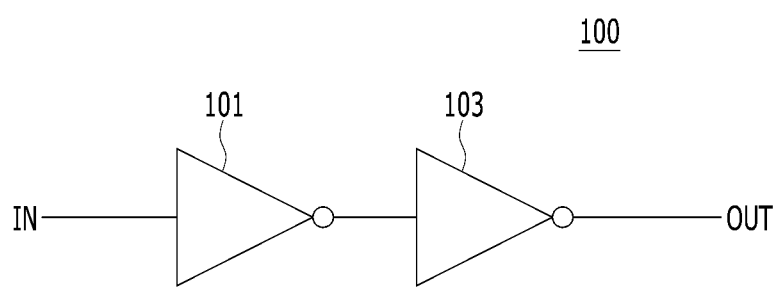
FIG. 1 is a block diagram illustrating a clock transmission circuit in accordance with an embodiment of the present invention.

Various embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

Figure 2:
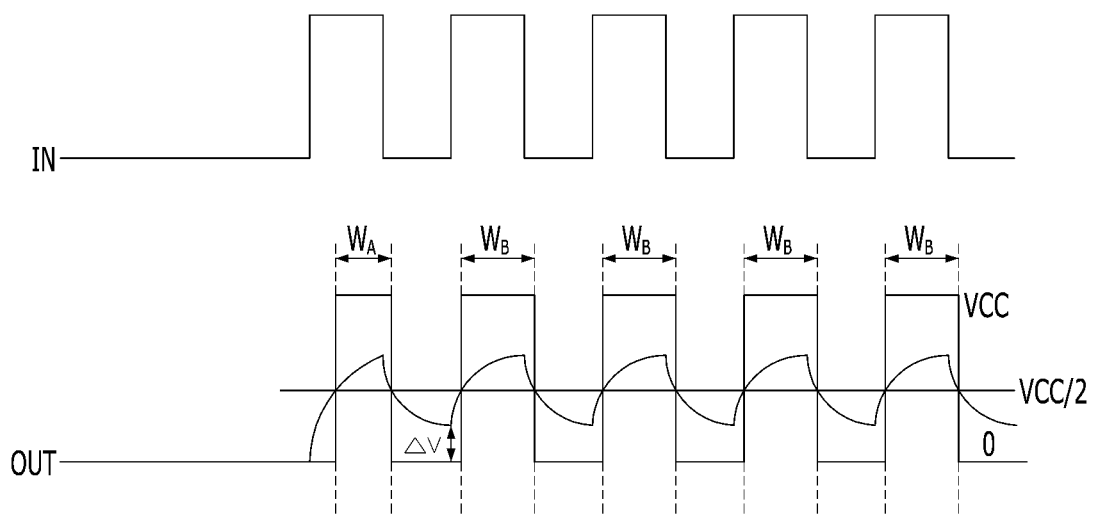
FIG. 2 is a timing diagram illustrating an operation of FIG. 1 in accordance with an embodiment of the present invention.

FIG. 1 is a block diagram illustrating a clock transmission circuit 100 in accordance with an embodiment of the present invention. FIG. 2 is a timing diagram illustrating an operation of FIG. 1 in accordance with an embodiment of the present invention.

Referring to FIG. 1, the clock transmission circuit 100 may include two inverters 101 and 103 that are coupled in series. The clock transmission circuit 100 may directly transmit the clock which is input to an input node IN to an output node OUT.

FIG. 2 shows the waveforms of the input node IN and the output node OUT of the clock transmission circuit 100. An actual analog waveform of the output node OUT and a digital waveform of the output node OUT are drawn in the FIG. 2. It may be seen that the digital waveform becomes 'high' or 'low' depending on whether the voltage level of the analog waveform is higher or lower than a VCC/2 level.

Referring to FIG. 2, when the clock is deactivated at a 'low' level and then activated and toggled, the pulse width WA of the first clock pulse may be narrower than other pulse widths WB. This is because the first pulse of the clock starts swinging from the voltage level 0, and the second pulse starts swinging from a ΔV level which is higher than 0.

That is, when the clock is deactivated and then activated, the swing width of the first pulse may be different from the swing widths of the second and subsequent pulses, so that the pulse width WA of the first pulse is smaller than the pulse widths WB of the second and subsequent pulses.

Figure 3:
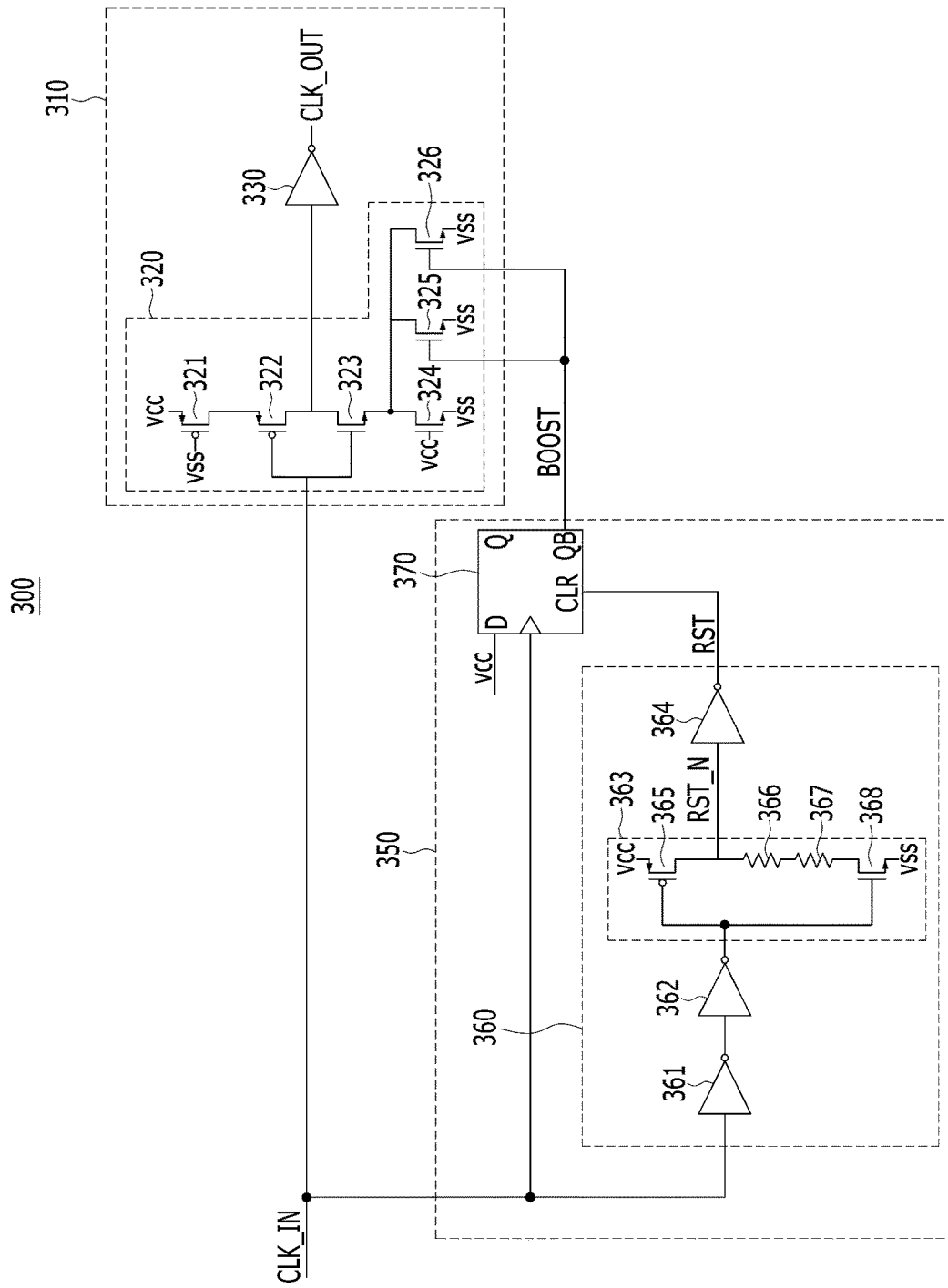
FIG. 3 is a block diagram illustrating a clock transmission circuit in accordance with another embodiment of the present invention.

FIG. 3 is a block diagram illustrating a clock transmission circuit 300 in accordance with another embodiment of the present invention.

Referring to FIG. 3, the clock transmission circuit 300 may include a clock driver circuit 310 and a driving force control circuit 350. The clock transmission circuit 300 may be used to transmit a clock in the inside of an integrated circuit chip, or may be used to transmit a clock between different integrated circuit chips.

The clock driver circuit 310 may be used to transmit an input clock CLK_IN to an output clock CLK_OUT. The driving force of the clock driver circuit 310 may be adjusted based on the boosting signal BOOST. To be specific, when the boosting signal BOOST is activated, a rising transition driving force by which the clock driver circuit 310 drives the output clock CLK_OUT from a 'low' level to a 'high' level may become strong. The clock driver circuit 310 may include a first inverter 320 for inverting and outputting the input clock CLK_IN, and a second inverter 330 for inverting the output of the first inverter 320 and output the output clock CLK_OUT. The amount of sinking current of the first inverter 320 may be adjusted based on the boosting signal BOOST.

The first inverter 320 may include PMOS transistors 321 and 322 and NMOS transistors 323, 324, 325 and 326. The PMOS transistor 321 may source an operation current of the first inverter 320 by receiving a ground voltage VSS at its gate and keeping on maintaining a turn-on state. The NMOS transistor 324 may sink the operation current of the first inverter 320 by receiving the power source voltage VCC at its gate and keeping on maintaining a turn-on state. The PMOS transistor 322 and the NMOS transistor 323 may invert the input clock CLK_IN and output it to an output node of the first inverter 320. The NMOS transistors 325 and 326 may be turned on when the boosting signal BOOST is activated to a 'high' level to sink the operation current of the first inverter 320, and may be turned off when the boosting signal BOOST is deactivated to a 'low' level. When the boosting signal BOOST is activated and the NMOS transistors 325 and 326 are turned on, the transition of the voltage level of the output node of the first inverter 320 from a 'high' level to a 'low' level may be accelerated. As a result, the transition of the output clock CLK_OUT output from the second inverter 330 from a 'low' level to a 'high' level may be accelerated. Namely, the rising of the output clock CLK_OUT may be accelerated.

The driving force control circuit 350 may generate the boosting signal BOOST to increase the rising transition driving force of the clock driver circuit 310 in a section where the input clock CLK_IN is of a low frequency, and to decrease the rising transition driving force of the clock driver circuit 310 in a section where the input clock CLK_IN is of a high frequency. The driving force control circuit 350 may include a low pass filter circuit 360 and a boosting signal generating circuit 370.

The low-pass filter circuit 360 may receive the input clock CLK_IN and output an initialization signal RST. The low-pass filter circuit 360 may hesitate to activate the initialization signal RST as the frequency of the input clock CLK_IN increases. The low pass filter circuit 360 may include four inverters 361, 362, 363, and 364 that are coupled in series. Among them, the inverter 363 may include a PMOS transistor 365, resistors 366 and 367, and an NMOS transistor 368. The PMOS transistor 365 may drive an output RST_N of the inverter 363 to a 'high' level when the input of the inverter 363 is at a 'low' level, and the NMOS transistor 368 may drive the output RST_N of the inverter 363 to a 'low' level when the input of the inverter 363 is at a 'high' level. The resistors 366 and 367 may interfere the NMOS transistor 368 from driving the output RST_N of the inverter 363 to a 'low' level. When the turn-on time of the NMOS transistor 368 is short due to the interference of resistors, that is, when the input clock CLK_IN is of a high frequency, the inverter 363 may have difficulty driving the output RST_N to a 'low' level. Therefore, when the input clock CLK_IN has a high frequency, the low pass filter circuit 360 may have difficulty driving the initialization signal RST which is generated by inverting the output RST_N, to a 'high' level.

The boosting signal generating circuit 370 may activate the boosting signal BOOST in response to an activation of the initialization signal RST, and deactivate the boosting signal BOOST in response to a rising edge of the input clock CLK_IN. Since the initialization signal RST cannot be activated in a section where the input clock CLK_IN is of a high frequency, the boosting signal BOOST may be maintained in an inactive state in a section where the input clock CLK_IN is of a high in frequency. Further, in a section where the input clock CLK_IN is of a low frequency, the boosting signal BOOST may be activated in response to an activation of the initialization signal RST to increase the rising driving force of the clock driver circuit 310, and the boosting signal BOOST may be deactivated in response to a rising of the input clock CLK_IN. After all, the boosting signal BOOST may be generated such that the clock driver circuit 310 strongly drives the rising of the output clock CLK_OUT in a section where the input clock CLK_IN has a low frequency.

The boosting signal generating circuit 370 may be formed of a D flip-flop. The power source voltage VCC, which is a signal fixed to a 'high' level, may be input to an input terminal D of the D flip-flop, and the input clock CLK_IN may be input to a clock terminal, and a boosting signal may be output from an inverted output terminal QB. Further, the D flip-flop may be initialized in response to the initialization signal RST. The D flip-flop may activate the boosting signal BOOST to a 'high' level in response to an activation of the initialization signal RST, and deactivate the boosting signal BOOST to a 'low' level in response to a rising edge of the input clock CLK_IN.

Figure 4:
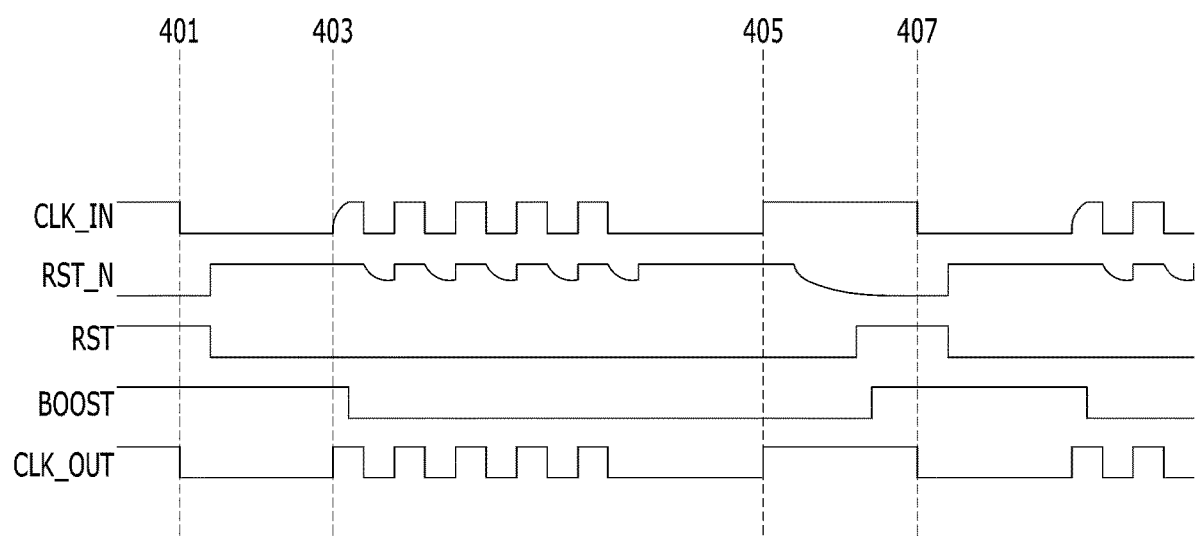
FIG. 4 is a timing diagram illustrating a high-speed operation of the clock transmission circuit shown in FIG. 3 in accordance with an embodiment of the present invention.

FIG. 4 is a timing diagram illustrating a high-speed operation of the clock transmission circuit 300 shown in FIG. 3 in accordance with an embodiment of the present disclosure.

Referring to FIG. 4, the input clock CLK_IN may maintain a 'high' state before a moment '401', and this section may be a reset section. From the moment '401' to a moment '403', the input clock CLK_IN may remain inactive at a 'low' level. This section may be called a preamble section, and from the moment '403' to a moment '405' which is a moment after the input clock CLK_IN toggles 5 times, the input clock CLK_IN may remain inactive at a 'low' level and this section may be a postamble section. After the postamble section, a section where the input clock CLK_IN maintains a 'high' state from a moment '405' to a moment '407' may be a reset section. A section from the moment '407' to a moment '409' when the input clock CLK_IN toggles may be a preamble section. There is a preamble section where the input clock CLK_IN is deactivated to a 'low' level before the input clock CLK_IN toggles, and there is a postamble section where the input clock CLK_IN is deactivated to a 'low' level after the input clock CLK_IN toggles. Further, there is a reset section where the input clock maintains a 'high' state between the postamble section and the preamble section.

The output signal RST_N of the inverter 363 inside the low pass filter circuit 360 is a signal which is obtained by delaying and inverting the input clock CLK_IN. The resistors 366 and 367 of the inverter 363 may interfere with the driving of the output signal RST_N to a 'low' level. In FIG. 4, it may be seen that the signal RST_N maintains the delayed and inverted form of the input clock CLK_IN, but in a high frequency section where the input clock CLK_IN toggles rapidly, the signal RST_N does not completely transition to a 'low' level but the level of the signal RST_N slowly decreases and then rises again.

The initialization signal RST may have a level obtained by inverting the output signal RST_N of the inverter 363, and the output signal RST_N of the inverter 363 may fail to transition to a 'low' level in a section where the input clock CLK_IN toggles rapidly. Therefore, it may be seen that the initialization signal RST is not activated to a 'high' level in the section where the input clock CLK_IN toggles rapidly.

The boosting signal BOOST may be activated in response to an activation of the initialization signal RST and may be deactivated in response to a rising edge of the input clock CLK_IN. There is a slight delay between the activation moment of the initialization signal RST and the activation moment of the boosting signal BOOSR, which may be a flipflop reset delay of the D flip-flop of the boosting signal generating circuit 370. Further, there is a slight delay between a rising edge of the input clock CLK_IN and a deactivation moment of the boosting signal BOOST, which is a D flip-flop CLK-to-QB delay of the boosting signal generating circuit 370.

The boosting signal BOOST may be activated to a 'high' level during a rising section of the first pulse of the input clock during a toggle section of the input clock CLK_IN. Therefore, the clock driver circuit 310 may strongly drive a rising of the first pulse of the output clock CLK_OUT, and as a result, the pulse width of the first pulse of the output clock CLK_OUT may be reduced shorter than the widths of the other pulses.

Figure 5:
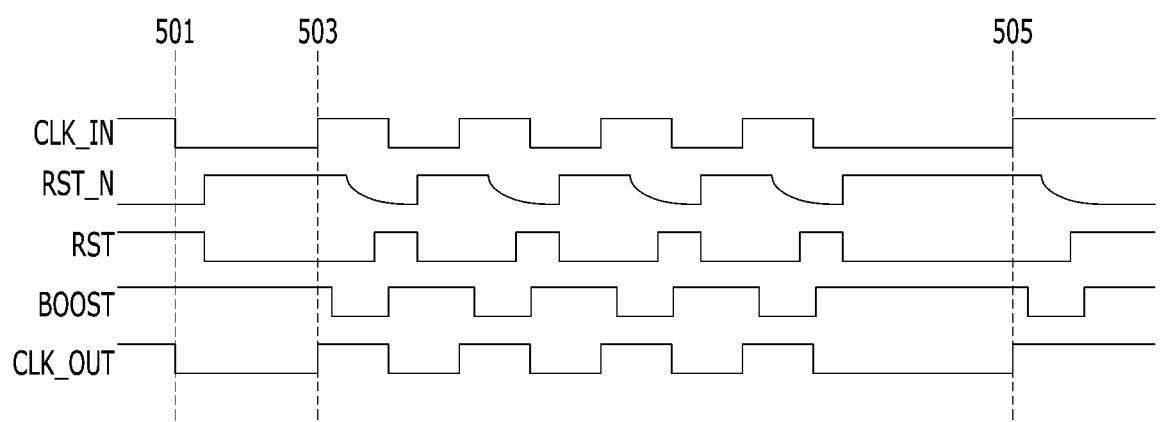
FIG. 5 is a timing diagram illustrating a low-speed operation of the clock transmission circuit shown in FIG. 3 in accordance with an embodiment of the present invention.

FIG. 5 is a timing diagram illustrating a low-speed operation of the clock transmission circuit 300 shown in FIG. 3 in accordance with an embodiment of the present disclosure.

Referring to FIG. 5, the preamble section of the input clock CLK_IN starting from a moment '501' may end and the input clock signal CLK_IN may start to toggle from a moment '503'. Even though the input clock CLK_IN toggles, the pulse width of the input clock CLK_IN may be quite wide because it toggles at a low frequency. Accordingly, the output signal RST_N of the inverter 363 inside the low pass filter circuit 360 may transition to a 'low' level even in a section where the input clock CLK_IN toggles. Accordingly, the initialization signal RST generated by inverting the output signal RST_N of the inverter 363 may also be activated several times in a section where the input clock CLK_IN toggles.

The boosting signal BOOST may be activated in response to an activation of the initialization signal RST and may be deactivated in response to a rising edge of the input clock CLK_IN repeatedly. Since the boosting signal BOOST is activated to a 'high' level for each rising section of the input clock CLK_IN, the clock driver circuit 310 may strongly drive the rising of the first to fourth pulses of the output clock CLK_OUT. The clock driver circuit 310 may strongly drive the rising of the output clock CLK_OUT whenever the output clock CLK_OUT toggles.

During a low-speed operation, the variation amount of the pulse width of the output clock CLK_OUT according to the activation/deactivation of the boosting signal BOOST may be small, and during a low-speed operation with a sufficiently wide pulse width, the variation of the pulse width is not sensitive. Therefore, such a change in the pulse width may not cause any problem in the stability of the operation of a system including the clock transmission circuit 310.

Figure 6:
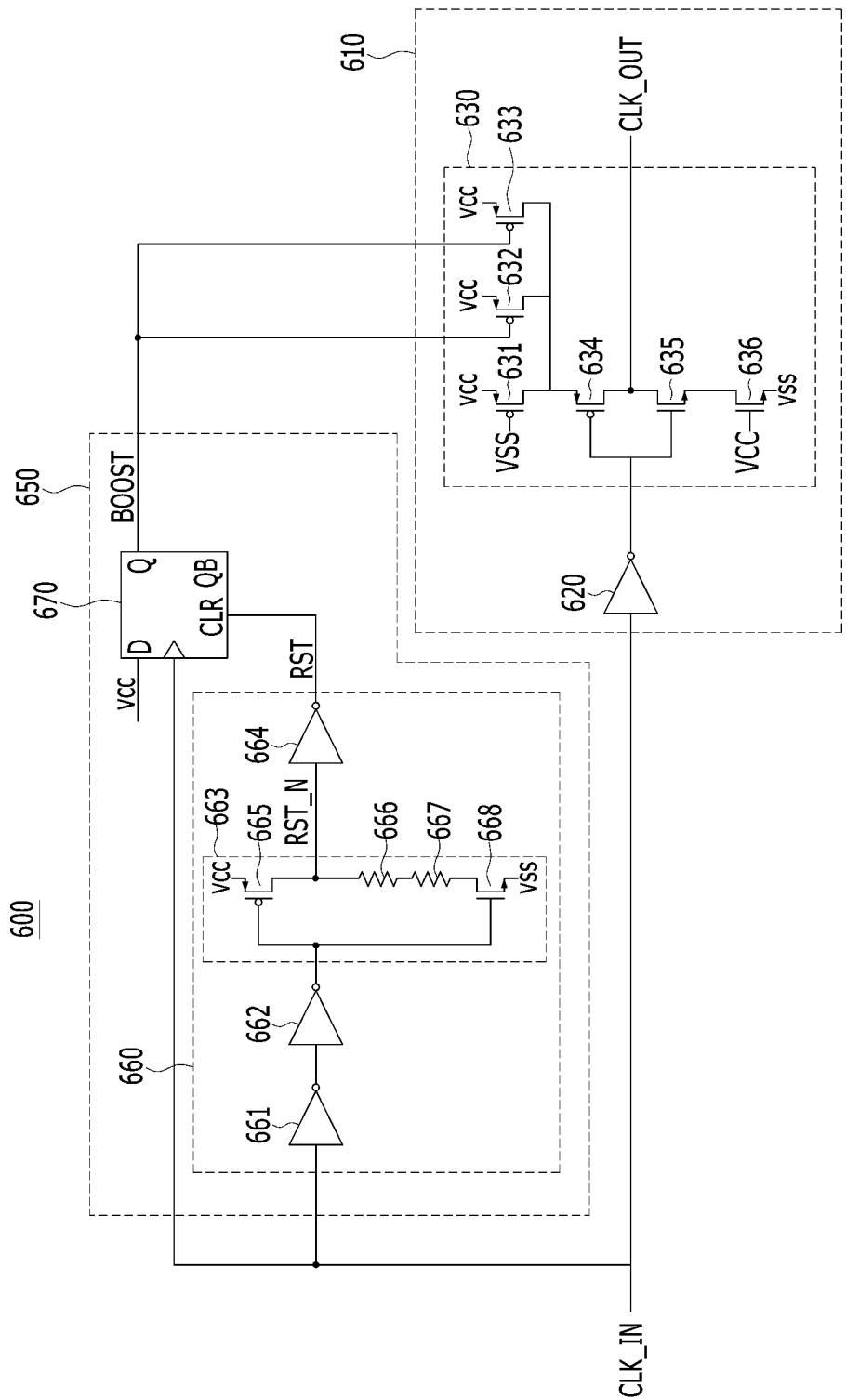
FIG. 6 is a block diagram illustrating a clock transmission circuit in accordance with yet another embodiment of the present invention.

FIG. 6 is a block diagram illustrating a clock transmission circuit 600 in accordance with yet another embodiment of the present invention.

Referring to FIG. 6, the clock transmission circuit 600 may include a clock driver circuit 610 and a driving force control circuit 650.

The clock driver circuit 610 may be used to transmit the input clock CLK_IN as the output clock CLK_OUT. The driving force of the clock driver circuit 610 may be adjusted based on the boosting signal BOOST. To be specific, when the boosting signal BOOST is activated, a rising transition driving force by which the clock driver circuit 610 drives the output clock CLK_OUT from a 'low' level to a 'high' level may become strong. The clock driver circuit 610 may include a first inverter 620 for inverting and outputting the input clock CLK_IN, and a second inverter 630 for inverting the output of the first inverter 620 and outputting the output clock CLK_OUT. Unlike the clock driver circuit 310 shown in FIG. 3, in the clock driver circuit 610 the amount of sourcing current of the second inverter 630 may be adjusted based on the boosting signal BOOST.

The second inverter 630 may include PMOS transistors 631, 632, 633, and 634 and NMOS transistors 635 and 636. The PMOS transistor 631 may receive the ground voltage VSS at its gate and maintain a turn-on state all the time to source the operation current of the second inverter 630. The NMOS transistor 636 may receive the power source voltage VCC at its gate and maintain the turn-on state all the time to sink the operation current of the second inverter 630. The PMOS transistor 634 and the NMOS transistor 635 may invert the output of the first inverter 620 and output the output clock CLK_OUT. The PMOS transistors 632 and 633 may be turned on when the boosting signal BOOST is activated to a 'low' level to source the operation current of the second inverter 630, and may be turned off when the boosting signal BOOST is deactivated to a 'high' level. When the boosting signal BOOST is activated and the PMOS transistors 632 and 633 are turned on, the operation that the output clock CLK_OUT output from the second inverter 630 transitions from a 'low' level to a 'high' level may be accelerated. Namely, the rising of the output clock (CLK_OUT) may become faster.

The driving force control circuit 650 may generate the boosting signal BOOST to increase the rising transition driving force of the clock driver circuit 610 in a section where the input clock CLK_IN is of a low frequency, and to decrease the rising transition driving force of the clock driver circuit 610 in a section where the input clock CLK_IN is of a high frequency. The driving force control circuit 650 may include a low pass filter circuit 660 and a boosting signal generating circuit 670.

The low-pass filter circuit 660 may receive the input clock CLK_IN and output the initialization signal RST. The low-pass filter circuit 660 may have difficulty activating the initialization signal RST as the frequency of the input clock CLK_IN becomes greater. The low pass filter circuit 660 may include four inverters 661, 662, 663, and 664 that are coupled in series. Among them, the inverter 663 may include a PMOS transistor 665, resistors 666 and 667, and an NMOS transistor 668. The PMOS transistor 665 may drive the output RST_N of the inverter 663 to a 'high' level when the input of the inverter 663 is of a 'low' level, and the NMOS transistor 668 may drive the output RST_N of the inverter 663 to a 'low' level when the input of the inverter 663 is of a 'high' level. The resistors 666 and 667 may interfere with the NMOS transistor 668 from driving the output RST_N of inverter 663 to a low level. When the turn-on time of the NMOS transistor 668 is short due to the interference of the resistors, that is, when the input clock CLK_IN has a high frequency, the output RST_N of the inverter 663 may hardly be driven to a 'low' level. Therefore, when the input clock CLK_IN has a high frequency, the low pass filter circuit 660 may have difficulty driving the initialization signal RST to a 'high' level, which is generated by inverting the output RST_N of the inverter 663.

The boosting signal generating circuit 670 may activate the boosting signal BOOST to a 'low' level in response to an activation of the initialization signal RST, and deactivate the boosting signal BOOST to a 'high' level in response to a rising edge of the input clock CLK_IN. Since the initialization signal RST is not activated in a section where the input clock CLK_IN is of a high frequency, the boosting signal BOOST may be maintained in an inactive state in a section where the input clock CLK_IN is of a high frequency. Further, in a section where the input clock CLK_IN is of a low frequency, the boosting signal BOOST may be activated in response to an activation of the initialization signal RST to increase the rising driving force of the clock driver circuit 610, and the boosting signal BOOST may be deactivated in response to a rising of the input clock CLK_IN. After all, the boosting signal BOOST may be generated such that the clock driver circuit 610 strongly drives the rising of the output clock CLK_OUT in a section where the input clock CLK_IN has a low frequency.

The boosting signal generating circuit 670 may be formed of a D flip-flop. The power source voltage VCC, which is a signal fixed to a 'high' level, may be input to an input terminal D of the D flip-flop, and the input clock CLK_IN may be input to a clock terminal, and a boosting signal may be output from an output terminal Q. Further, the D flip-flop may be initialized in response to the initialization signal RST. The D flip-flop may activate the boosting signal BOOST to a 'low' level in response to an activation of the initialization signal RST, and deactivate the boosting signal BOOST to a 'high' level in response to a rising edge of the input clock CLK_IN.

The clock transmission circuit 600 of FIG. 6 may operate in the same manner as the clock transmission circuit 300 of FIG. 3, except that it adjusts the driving force of the second inverter 630 of the clock driver 610 based on the boosting signal BOOST and the activation level of the boosting signal BOOST is of a 'low' level. Therefore, further detailed description for the clock transmission circuit of FIG. 6 will be omitted.

According to the embodiments of the present invention, the quality of a clock transmitted by a clock transmission circuit may be raised.

While the present invention has been described with respect to the specific embodiments, it will be apparent to those skilled in the art that various changes and modifications may be made without departing from the spirit and scope of the invention as defined in the following claims. Furthermore, the embodiments may be combined to form additional embodiments.

What is claimed is:

1. A clock transmission circuit comprising:
   a clock driver circuit suitable for transmitting a clock and adjusting a driving force thereof in response to a boosting signal;
   a low-pass filter circuit suitable for receiving the clock and outputting an initialization signal; and
   a boosting signal generating circuit suitable for generating the boosting signal that is activated in response to the initialization signal and deactivated in response to the clock.

2. The clock transmission circuit of claim 1, wherein the boosting signal generating circuit activates the boosting signal in response to an activation of the initialization signal, and deactivates the boosting signal in response to a rising edge of the clock.

3. The clock transmission circuit of claim 1, wherein the clock driver circuit adjusts the driving force by increasing an amount of current running while the boosting signal is activated.

4. The clock transmission circuit of claim 1, wherein as the frequency of the clock becomes higher, the low-pass filter circuit interrupts activation of the initialization signal.

5. The clock transmission circuit of claim 4,
   wherein the boosting signal generating circuit includes a D flip-flop suitable for receiving a signal fixed to a high level through an input terminal thereof, receiving the clock through a clock terminal thereof and outputting the boosting signal through an inverted output terminal thereof, and
   wherein the activated initialization signal initializes the D flip-flop.

6. The clock transmission circuit of claim 5, wherein the clock driver circuit includes:
   a first inverter suitable for inverting the clock to output a first clock and increasing an amount of sinking current therein when the boosting signal is activated; and
   a second inverter suitable for inverting the first clock to output a second clock.

7. The clock transmission circuit of claim 4,
   wherein the boosting signal generating circuit includes a D flip-flop suitable for receiving a signal fixed to a high level through an input terminal thereof, receiving the clock through a clock terminal thereof and outputting the boosting signal through an output terminal thereof, and
   wherein the activated initialization signal initializes the D flip-flop.

8. The clock transmission circuit of claim 7, wherein the clock driver circuit includes:
   a first inverter suitable for inverting the clock to output a third clock; and
   a second inverter suitable for inverting the third clock to output a fourth clock and increasing an amount of sourcing current therein when the boosting signal is activated.

9. A clock transmission circuit comprising:
   a clock driver circuit suitable for transmitting a clock; and
   a driving force control circuit suitable for increasing a rising transition driving force of an output of the clock driver circuit in a section where the clock is of a low frequency and decreasing the rising transition driving force in a section where the clock is of a high frequency.

10. The clock transmission circuit of claim 9, wherein the clock driver circuit increases or decreases the rising transition driving force by controlling an amount of an operation current therein.

11. A semiconductor apparatus comprising:
a clock driver configured to drive an input clock to output an output clock, the input clock staying high in a reset section, staying low in a pre-amble section and toggling in a post-amble section, and a set of the sections being repetitive;
a low-pass filter configured to generate an initialization signal, which toggles when the input clock toggles at a low frequency and transitions according to transition of the input clock at both ends of the reset section; and
a boosting circuit configured to enable a boosting signal according to a rising edge of the initialization signal and disable the boosting signal according to a rising edge of the input clock in the post-amble section,
wherein the clock driver is further configured to increase, in response to the enabled boosting signal, a driving force thereof to accelerate at least initial transition of the output clock from a logic low level to a logic high level in the post-amble section.

* * * * *